United States Patent
Hatano et al.

(10) Patent No.: US 6,372,061 B1
(45) Date of Patent: Apr. 16, 2002

(54) ROLLED COPPER FOIL FOR FLEXIBLE PRINTED CIRCUIT AND METHOD OF MANUFACTURING THE SAME

(75) Inventors: Takaaki Hatano; Yoshio Kurosawa, both of Samukawa-machi (JP)

(73) Assignee: Nippon Mining & Metals Co., Ltd., Tokyo (JP)

(*) Notice: Subject to any disclaimer, the term of this patent is extended or adjusted under 35 U.S.C. 154(b) by 0 days.

(21) Appl. No.: 09/431,910

(22) Filed: Nov. 2, 1999

(30) Foreign Application Priority Data

Nov. 17, 1998 (JP) ............................................. 10-326531
Jan. 18, 1999 (JP) ............................................. 11-009437

(51) Int. Cl.[7] ................................................. C22C 9/00
(52) U.S. Cl. ........................................ 148/432; 428/901
(58) Field of Search ................................. 148/432, 682; 428/901; 29/17.1; 174/60.64; 420/497

(56) References Cited

FOREIGN PATENT DOCUMENTS

| JP | 62116742 | * | 5/1987 |
| JP | 04290286 | * | 10/1992 |

* cited by examiner

*Primary Examiner*—Sikyin Ip
(74) *Attorney, Agent, or Firm*—Drinker Biddle & Reath LLP

(57) ABSTRACT

A rolled copper foil for flexible printed circuits comprising, all by weight, from 0.0100 to 0.0400% of Ag, from 0.0100 to 0.0500% of oxygen, not more than 0.0030% in total of one or more elements selected from the group consisting of S, As, Sb, Bi, Se, Te, Pb, and Sn, and the balance copper, the foil having a thickness in the range of 5 to 50 μm, a half-softening temperature of 120 to 150° C., being capable of retaining a tensile strength of at least 300 N/mm$^2$ at 30° C., and possessing excellent flex fatigue property and adequate softening property. The intensity (I) of the (200) plane determined by X-ray diffraction of the rolled surface after annealing at 200° C. for 30 minutes is $I/I_o > 20$ with respect to the X-ray diffraction intensity ($I_o$) of the (200) plane of fine copper powder. A method of manufacturing the rolled copper foil by a process which comprises hot rolling an ingot, repeating cold rolling and annealing alternately, and finally cold rolling the work to a foil, the annealing immediately preceding the final cold rolling being performed under conditions that enable the annealed recrystallized grains to have a mean grain diameter of not greater than 20 μm, the reduction ratio of the final cold rolling being beyond 90.0%, whereby excellent flex fatigue property and adequate softening property are achieved.

2 Claims, 2 Drawing Sheets

ROLLED COPPER FOIL FOR FLEXIBLE PRINTED CIRCUIT AND METHOD OF MANUFACTURING THE SAME

BACKGROUND OF THE INVENTION

1. Field of the invention

This invention relates to flexible wiring members such as flexible printed circuits (hereinafter called "FPCs") having excellent flex performance with ease of fabrication.

2. Prior art

Printed wiring boards based on organic substrates are roughly divided into two types; rigid type with a rigid, copper-clad laminate consisting of glass-epoxy and paper-phenol substrates and flexible type with a flexible, copper-clad laminate consisting of polyimide and polyester substrates. Copper foil is mainly employed as conductive material for the printed wiring boards. The foil products are classified into electrodeposited and rolled foils depending on the manufacturing processes used.

Of the printed wiring boards, those for flexible printed circuits (FPCs) are fabricated by laminating a copper foil to a resin substrate and joining the layers with adhesive or with the application of heat and pressure into an integral board. In recent years, multilayer boards known as built-up boards have come into extensive use as effective means for high-density packaging or mounting. The copper foil that is used to form components for FPCs is, for the most part, rolled copper foil.

FPCs are largely used in printer heads, hard disk drives, and other components where wiring or conductive connections to movable parts are required. They are subjected to more than a million times of repetitive bending in service. With the recent tendency toward miniaturization and higher performance levels of devices, the requirement for the flex performance is becoming severer than heretofore.

The material for copper foil to be used in FPCs is mostly tough-pitch copper (containing 100–500 ppm oxygen). The foil is manufactured by hot rolling an ingot of such material and then repeating cold rolling and annealing alternately until a predetermined thickness is achieved. The rolled copper foil is then plated for surface roughing for enhanced adhesion to a resin substrate. Following the roughing plating, the copper foil is cut into pieces and each piece is laminated to a resin substrate. To join the copper foil and resin together, an adhesive of thermosetting resin, e.g., epoxy, is used. The adhesive is hardened by heating at 130 to 170° C. for several hours to several days. Thereafter the copper foil is etched to form various wiring or conductive patterns.

The flex property of a copper foil is markedly improved by recrystallization annealing over that of the foil as rolled. Therefore, the foil is used in the annealed state as an FPC component. The annealing is done either by heat treatment after the roughing plating and cutting into a size or by utilizing the heating at the time of adhering to the resin substrate. The reason for which the annealing is performed during the course of fabrication rather than using an annealed copper foil from the beginning is that, when the copper foil is soft after annealing, it can be deformed or wrinkled upon cutting and laminating to the resin substrate, and a foil hard as rolled is preferred because of the ease of fabrication into an FPC.

For enhanced flex performance of an FPC, improving the flex fatigue property of a rolled copper foil as the starting material is beneficial. The flex fatigue property of an annealed copper foil is improved with the development of its cube texture. In order to help develop the cube texture, it is effective in the copper foil manufacturing process to increase the final rolling reduction ratio and decrease the grain diameter with the annealing immediately before the final rolling (Japanese Patent Application No. 10-101858).

Actually, a copper foil manufactured by such a process shows a sharp drop of the softening temperature due to an increase in the plastic strain accumulated by rolling. In extreme cases the foil, even stored at room temperature, can soften after a long period of storage. As noted already, a softened copper foil, if used in the fabrication of an FPC, can cause troubles such as foil deformation and seriously affect the ease of FPC fabrication. For these reasons it is necessary, when the above manufacturing process is adopted to obtain a copper foil with improved flex property, to heighten the softening temperature of the copper foil to a proper level.

The problem of rolled copper foil softening while being stored at room temperature is pointed out also by Japanese Patent Application Kokai No. 10-230303. The prior application, as a means of controlling the problem, proposes manufacturing a copper foil at a low rolling reduction ratio of 50–90%. In fact, however, a copper foil made at such a low rolling reduction ratio has seriously deteriorated flex fatigue property, and the proposed means is not acceptable when a copper foil with excellent flex property is to be obtained. Under the circumstances the present invention aims at raising the softening temperature of a copper foil to a proper level by adding trace amounts of alloying elements to an ordinary tough-pitch copper foil. Various copper alloy foils with additions of many different elements have hitherto been proposed for use in FPCs. However, none of them have proved helpful in solving the problem that the present invention faces; for example, (1) one of the purposes for which an alloying element is added is to inhibit the development of the (100) orientation of a cube texture, and the softening temperature of the resulting alloy foil is unusually high (Japanese Patent No. 2505480), and (2) a large proportion of an alloying element(s) is added to copper to improve its flex resistance (Japanese Patent Application Kokai No. 59-78592).

SUMMARY OF THE INVENTION

The object of the present invention is to provide a rolled copper foil for FPCs which combines excellent flex property with adequate softening property, by appropriately elevating the softening temperature of a high-flexing rolled copper foil to eliminate the troubles that can otherwise result from its softening during storage.

The present invention settles the problems of the prior art and concerns the following: (1) A rolled copper foil for flexible printed circuits comprising, all by weight, from 0.0100 to 0.0400% of Ag, from 0.0100 to 0.0500% of oxygen, not more than 0.0030% in total of one or more elements selected from the group consisting of S, As, Sb, Bi, Se, Te, Pb, and Sn, and the balance copper, said foil having a thickness in the range of 5 to 50 µm, a half-softening temperature of 120 to 150° C., being capable of retaining a tensile strength of at least 300 N/mm² at 30° C., and possessing excellent flex property and adequate softening properties.

(2) A rolled copper foil for flexible printed circuits comprising, all by weight, from 0.0100 to 0.0400% of Ag, from 0.0100 to 0.0500% of oxygen, not more than 0.0030% in total of one or more elements selected from the group consisting of S, As, Sb, Bi, Se, Te, Pb, and Sn, and the balance copper, said foil having a thickness in the range of 5 to 50 µm, the intensity (I) of the (200) plane determined by X-ray diffraction of the rolled surface after annealing at 200° C. for 30 minutes being $I/I_o>20$ with respect to the X-ray diffraction intensity ($I_o$) of the (200) plane of fine copper powder, said foil having a half-softening temperature of 120 to 150° C., being capable of retaining a tensile strength of at least 300 N/mm² at 30° C., and possessing excellent flex property and adequate softening properties.

(3) A method of manufacturing the rolled copper foil according to (1) and (2) above by a process which comprises hot rolling an ingot, repeating cold rolling and annealing alternately, and finally cold rolling the work to a foil, the annealing immediately preceding the final cold rolling being performed under conditions that enable the annealed recrystallized grains to have a mean grain diameter of not greater than 20 µm, the reduction ratio of the final cold rolling being beyond 90.0%, whereby excellent flex property and adequate softening property are achieved.

DETAILED DESCRIPTION OF THE INVENTION

When a copper foil is made by a process which involves a high reduction ratio or formation of fine grains to produce a developed cube texture, its flex fatigue property is improved but its softening temperature becomes too low. However, judicious control of trace constituents in the material to raise the softening temperature will enable the resulting copper foil to have an adequate softening temperature.

The expression "adequate softening temperature" as used herein may be defined by two conditions:

(1) While the tensile strength of an as-rolled copper foil is in the range of 400–500 N/mm², the foil should retain a tensile strength of not less than 300 N/mm² after standing at 30° C. for one year.

(2) The copper foil should soften upon heat treatment either after the roughing plating and cutting into a size or at the time of adhering to the resin substrate.

The temperature corresponds to the range of 120–150° C. in terms of the half-softening temperature obtained by annealing for 30 minutes (the annealing temperature at the point where the tensile strength is intermediate between that before the annealing and that at complete softening).

The present inventors have now found that Ag is the most suitable element for controlling the ingot making by melting so that the tough-pitch copper foil manufactured by a process which imparts excellent flex property can have a softening temperature within the target range. The reasons will be explained in more detail below.

(1) Elements less noble than Cu oxidize upon addition to the latter and their concentrations can hardly be controlled in a stable manner. On the other hand, Ag is more noble than Cu and its concentration is easier to control.

(2) Elements added to Cu show much greater softening-inhibiting effects in the state of solid solutions than in the state of precipitates. For example, in the case of an element such as S whose solubility in solid Cu is low and is variable widely with temperature, annealing causes a solid solution/precipitation reaction of the added element, and the reaction materially influences the softening property of the product. In order to control the softening temperature, therefore, it is necessary to adjust not only the amount of the element to be added but also the solid solution/precipitation reaction. The solubility of Ag in Cu is high, of the order of 0.1 wt % at 200° C., and, even if it is added in a considerable amount, Ag remains in the form of solid solution in Cu. This means that adjusting only the amount to be added makes it possible to control the softening temperature.

(3) Generally the electrical conductivity of Cu is decreased by the addition of an element. Ag is exceptional in that its addition does not lower the conductivity of Cu.

(4) Some elements, when added to Cu, hamper the development of a cube texture upon annealing and thereby deteriorate the flex fatigue property of the product. Ag, even when added in an amount of as much as several hundred parts per million, does not inhibit the cube texture development.

As stated above, the present invention is primarily aimed at controlling the softening temperature of the resulting foil within a suitable range through the addition of Ag to ordinary tough-pitch copper. More precise control of the softening temperature is made possible by restricting the contents of impurities other than Ag in the tough-pitch copper below predetermined levels.

The grounds on which various limitations are specified for the rolled copper foil according to the invention will be explained below.

Under the invention the rolled copper foil is intended to retain a tensile strength of not less than 300 N/mm² continuously at room temperature. More desirably the foil is intended to possess a tensile strength of not less than 300 N/mm² even after storage for one year at 30° C.

Here 30° C. corresponds to a temperature above the average annual temperature in Japan. The expression "continuously" used for the storage period before the copper foil is fabricated into FPCs means that the foil is usually stored continuously, for one year at the most. With a tensile strength of 300 N/mm² or more, the copper foil has no wrinkling or other trouble during fabrication. There is practically no problem, therefore, when the copper foil is capable of retaining a tensile strength of not less than 300 N/mm² when allowed to stand at 30° C. for one year. Such softening property correspond, in terms of the half-softening temperature obtained by annealing for 30 minutes, to a temperature of 120° C. or upwards.

However, when the half-softening temperature by 30-minute annealing exceeds 150° C., the copper foil is sometimes not softened by the heat treatment either after the roughing plating and cutting into a size or at the time of adhering to the resin substrate. That is why the half-softening temperature by 30-minute annealing is specified to be in the range of 120–150° C.

If the resulting FPC is to have enhanced flex fatigue property, the copper foil must have enhanced flex fatigue property itself. The copper foil is incorporated in a recrystallized state in the FPC, and if the cube texture as a recrystallization texture of pure Cu is allowed to develop, the copper foil attains improved flex fatigue property. The degree of development of the cube texture that produces satisfactory flex fatigue property is specified to be such that the intensity of the (200) plane determined by X-ray diffraction of the rolled surface is to be $I/I_o>20$, preferably $I/I_o>40.0$, with respect to the X-ray diffraction intensity ($I_o$) of the (200) plane of fine copper powder. Here the annealing at 200° C. for 30 minutes is conducted to recrystallize the copper foil for the measurement of its X-ray diffraction intensity.

The Ag content is specified to be 0.0100–0.040 wt % in order to raise the half-softening temperature of the copper foil that has fallen in the course of manufacture that develops its cube texture, to an appropriate range. If the Ag concentration is less than 0.0100 wt % the half-softening temperature falls below 120° C., whereas a concentration beyond 0.0400 wt % raises the temperature above 150° C.

S, As, Sb, Bi, Se, Te, Pb, and Sn are impurities usually contained in tough-pitch copper, with relatively large bearings upon its half-softening temperature. When the half-softening temperature is to be controlled by the addition of Ag, the control is made easier by restricting the concentrations of these impurities within low levels. Since these impurities mostly originate from the electrolytic copper used as the material for tough-pitch copper foil, the impurity contents of the electrolytic copper should be adjusted so as to control their concentrations in the product.

It is desirable that the amount in total of one or more elements selected from the group consisting of S, As, Sb, Bi, Se, Te, Pb, and Sn be not more than 0.0030 wt %. If the amount exceeds 0.0030 wt % the half-softening temperature varies greatly even when the Ag concentration remains the same. The half-softening temperature can rise above 150° C. depending on the Ag concentration.

Oxygen-free copper of ordinary purity is known to have a remarkably higher softening temperature than tough-pitch copper because of its lower oxygen concentration. Oxygen contained to excess in tough-pitch copper forms an inclusion of $Cu_2O$. Under the invention the oxygen concentration is confined within the range of 0.0100–0.0500 wt % since the addition of Ag while the oxygen concentration is less than 0.0100 wt % boosts the half-softening temperature beyond 150° C., whereas an oxygen concentration in excess of 0.0500 wt % increases the $Cu_2O$ inclusion and thereby lowers the flex fatigue property of the product.

As for the thickness of a copper foil, the thinner the better the flex fatigue property because of the lower strains produced around the bend. If the foil is more than 50 μm thick, desired flex fatigue property will no longer be attained even when the cube texture is developed. Conversely if the thickness is less than 5 μm, the foil becomes difficult to handle since insufficient strength can cause rupture or other failure. Hence the specified foil thickness range of 5–50 μm.

The copper foil according to the present invention is finished as such by cold rolling to a reduction ratio in excess of 90.0% following recrystallization annealing under conditions that produce a mean grain diameter of not greater than 20 μm. If the mean diameter upon the annealing that precedes the rolling is more than 20 μm or if the reduction ratio is less than 90.0%, then $I/I_o<20$ and no favorable flex fatigue property will be achieved. The annealing before the final cold rolling may be combined with the hot rolling, in which case too it is desirable that the grain size as hot rolled be adjusted to be not greater than 20 μm.

DESCRIPTION OF THE PREFERRED EMBODIMENTS

Figure 1:
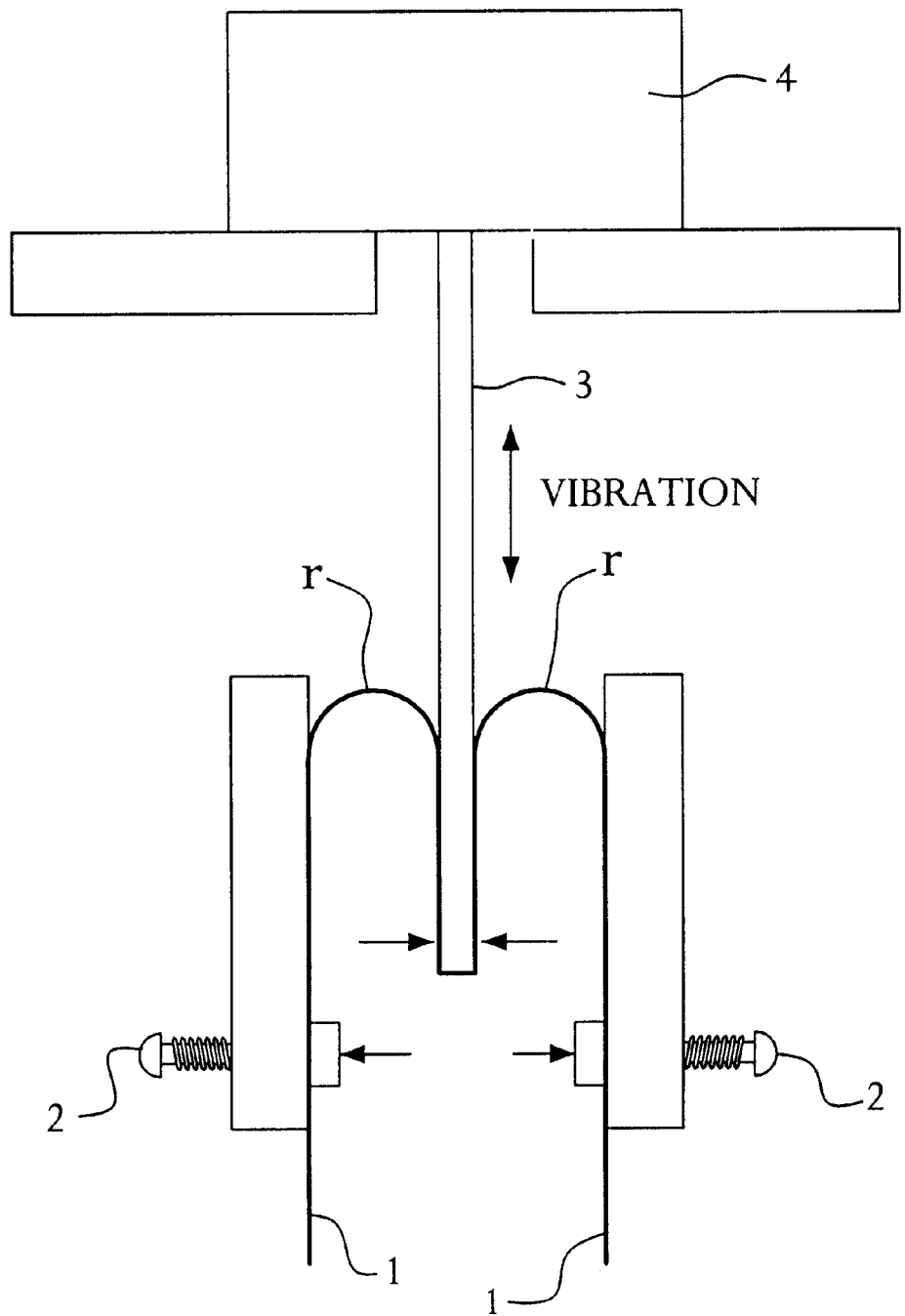
FIG. 1 is a schematic view of a flex tester used to determine the flex fatigue life of test foils.

The invention will be more fully described below as embodied in Example Nos. 1–18.

Copper ingots of the compositions shown in Table 1, each measuring 200 mm thick and 600 mm wide, were made and then hot rolled to a thickness of 10 mm each.

TABLE 1

| | | | | Components | | | | | | | |
|---|---|---|---|---|---|---|---|---|---|---|---|
| | | Ag | O | S, As, Sb, Bi, Se, Te, Pb, Sn concentrations (wt %) | | | | | | | |
| | No. | (wt %) | (wt %) | S | As | Sb | Bi | Se | Te | Pb | Sn | Total |
| Example of this invention | 1 | 0.0110 | 0.0201 | 0.00030 | 0.00004 | 0.00006 | <0.00001 | <0.00001 | <0.00001 | <0.00001 | 0.00011 | 0.0005 |
| | 2 | 0.0174 | 0.0229 | 0.00042 | 0.00007 | 0.00005 | 0.00001 | <0.00001 | <0.00001 | <0.00001 | 0.00009 | 0.0006 |
| | 3 | 0.0204 | 0.0242 | 0.00026 | 0.00006 | 0.00003 | <0.00001 | 0.00002 | 0.00001 | 0.00003 | 0.00012 | 0.0005 |
| | 4 | 0.0254 | 0.0223 | 0.00025 | 0.00004 | 0.00006 | <0.00001 | <0.00001 | <0.00001 | <0.00001 | 0.00020 | 0.0006 |
| | 5 | 0.0298 | 0.0204 | 0.00011 | 0.00004 | 0.00011 | <0.00001 | 0.00003 | 0.00002 | 0.00002 | 0.00018 | 0.0005 |
| | 6 | 0.0360 | 0.0242 | 0.00049 | 0.00002 | 0.00004 | <0.00001 | <0.00001 | 0.00002 | <0.00001 | 0.00006 | 0.0006 |
| | 7 | 0.0394 | 0.0213 | 0.00038 | 0.00005 | 0.00005 | 0.00001 | 0.00001 | 0.00003 | <0.00001 | 0.00008 | 0.0006 |
| | 8 | 0.0160 | 0.0210 | 0.00030 | 0.00007 | 0.00008 | <0.00001 | <0.00001 | <0.00001 | <0.00001 | 0.00011 | 0.0006 |
| | 9 | 0.0310 | 0.0165 | 0.00125 | 0.00005 | 0.00003 | <0.00001 | 0.00002 | 0.00002 | 0.00003 | 0.00018 | 0.0016 |
| | 10 | 0.0264 | 0.0165 | 0.00080 | 0.00006 | 0.00002 | <0.00001 | 0.00003 | 0.00001 | 0.00002 | 0.00021 | 0.0012 |
| | 11 | 0.0226 | 0.0450 | 0.00022 | 0.00005 | 0.00004 | <0.00001 | <0.00001 | <0.00001 | <0.00001 | 0.00008 | 0.0004 |
| | 12 | 0.0296 | 0.0286 | 0.00138 | 0.00016 | 0.00012 | 0.00003 | 0.00007 | 0.00012 | 0.00036 | 0.00054 | 0.0028 |
| | 13 | 0.0126 | 0.0313 | 0.00104 | 0.00004 | 0.00006 | <0.00001 | <0.00001 | <0.00001 | 0.00007 | 0.00031 | 0.0015 |
| | 14 | 0.0348 | 0.0132 | 0.00098 | 0.00019 | 0.00013 | 0.00002 | 0.00011 | 0.00009 | 0.00021 | 0.00048 | 0.0022 |
| | 15 | 0.0210 | 0.0400 | 0.00038 | 0.00012 | 0.00008 | 0.00002 | 0.00001 | 0.00003 | 0.00023 | 0.00015 | 0.0010 |
| | 16 | 0.0220 | 0.0397 | 0.00036 | 0.00009 | 0.00003 | 0.00001 | 0.00001 | 0.00001 | 0.00015 | 0.00043 | 0.0011 |
| | 17 | 0.0240 | 0.0216 | 0.00039 | 0.00004 | 0.00007 | <0.00001 | <0.00001 | <0.00001 | <0.00001 | 0.00017 | 0.0007 |
| | 18 | 0.0244 | 0.0228 | 0.00060 | 0.00005 | 0.00004 | <0.00001 | 0.00002 | <0.00001 | 0.00009 | 0.00003 | 0.0008 |
| Comparative example | 1 | 0.0076 | 0.0330 | 0.00022 | 0.00003 | 0.00005 | <0.00001 | <0.00001 | <0.00001 | <0.00001 | 0.00010 | 0.0004 |
| | 2 | 0.0026 | 0.0214 | 0.00038 | 0.00005 | 0.00004 | 0.00001 | <0.00001 | <0.00001 | 0.00003 | 0.00008 | 0.0006 |
| | 3 | 0.0464 | 0.0239 | 0.00008 | 0.00003 | 0.00005 | <0.00001 | 0.00004 | <0.00001 | 0.00010 | 0.00021 | 0.0005 |
| | 4 | 0.0386 | 0.0207 | 0.00180 | 0.00006 | 0.00011 | 0.00002 | 0.00012 | 0.00008 | 0.00015 | 0.00089 | 0.0032 |
| | 5 | 0.0300 | 0.0011 | 0.00085 | 0.00006 | 0.00004 | <0.00001 | 0.00002 | <0.00001 | 0.00009 | 0.00021 | 0.0013 |
| | 6 | 0.0218 | 0.0676 | 0.00014 | 0.00004 | 0.00005 | <0.00001 | <0.00001 | <0.00001 | <0.00001 | 0.00007 | 0.0003 |
| | 7 | 0.0228 | 0.0385 | 0.00039 | 0.00006 | 0.00002 | 0.00002 | 0.00006 | 0.00003 | 0.00024 | 0.00038 | 0.0012 |
| | 8 | 0.0222 | 0.0340 | 0.00055 | 0.00003 | 0.00006 | <0.00001 | <0.00001 | <0.00001 | 0.00011 | 0.00020 | 0.0010 |
| | 9 | 0.0354 | 0.0255 | 0.00049 | 0.00004 | 0.00005 | <0.00001 | <0.00001 | <0.00001 | <0.00001 | 0.00018 | 0.0008 |

Annealing and cold rolling were then repeated and sheets of to mm thickness as rolled were obtained. The sheets were annealed and recrystallized and, after the removal of oxide scale, they were cold rolled to a desired thickness of t mm. The reduction ratio R by the final cold rolling is given by $$R=(t_o-t)/t_o \times 100(\%).$$

After the annealing before the final cold rolling the annealed grain diameter was determined by counting the intercept of straight line at the grain boundary on the transverse cross section.

With test specimens of copper foils thus produced under varied process annealing conditions and at varied final rolling reduction ratios, their properties were evaluated as below.

(1) Cube texture

Each specimen was heated at 200° C. for 30 minutes, and the integrated value of intensity (I) of the (200) plane as determined by X-ray diffraction of the rolled surface was found. The value was divided by the predetermined integrated value of intensity ($I_o$) of the (200) plane of a fine copper powder to calculate the $I/I_o$. The integrated value of peak intensity was measured using a Co X-ray tube within the range of $2\theta=57–63°$ ($\theta$=diffraction angle).

(2) Flex fatigue property

Each specimen was heated at 200° C. for 30 minutes for recrystallization, and then its flex fatigue life was determined using a flex tester illustrated in FIG. 1. The tester comprises a vibration drive unit 4 and a vibration transmitting member 3 connected to the drive unit. A test foil 1 is fixed in place at a total of four points indicated by arrows; at the ends of screws 2 and at the lower end of the member 3. As the vibrating member 3 is driven up and down, intermediate portions of the foil 1 are bent like hairpins at a given radius of curvature r. In the test under review, the number of flex cycles to failure was counted by repeating the bending under the following conditions:

The width of test specimen=12.7 mm; length of specimen=200 mm; sampling direction=each specimen was cut off so that its length was parallel to the direction of rolling; radius of curvature r=2.5 mm; vibration stroke=25 mm; and vibration speed=1500 vibrations/min.

When the flex fatigue life exceeded 30,000 flex cycles, the specimen was deemed to have excellent flex fatigue property. The test was an accelerated test, conducted under conditions severer than when the FPCs are actually in service.

(3) Half-softening temperature

Test specimens were annealed for 30 minutes at varied temperatures and then tested for tensile strength. The annealing temperature at which the tensile strength value was intermediate between the as-rolled tensile strength and the tensile strength of the specimen completely softened by annealing at 300° C. for 30 minutes was determined. When a specimen showed a half-softening temperature in the range of 120–150° C. it was judged to possess adequate softening property.

(4) Softening behavior at room temperature

Test materials as rolled were stored in a thermostat kept at 30° C. They were tested for tensile strength monthly after the start of storage, and the periods in which their tensile strength values declined below 300 N/mm$^2$ were determined. The evaluation was performed up to a total period of 12 months.

Table 2 summarizes the histories of working and properties of the copper foils tested. The rolled copper foils according to the invention exhibited $I/I_o$ values of greater than 20 owing to the development of the cube texture by annealing. Consequently they showed excellent flex fatigue life of more than 30,000 flex cycles. Their softening temperatures came within the target range of 120–150° C., and their tensile strength values after one-year storage at room temperature (30° C.) were still in excess of 300 N/mm$^2$.

TABLE 2

| | | Manufacturing process | | | | | |
|---|---|---|---|---|---|---|---|
| | No. | Thickness (μm) | Grain dia. before rolling (μm) | Final roll reduction ratio (%) | $I/I_0$ of the (200) plane of cube texture | No. of flex cycles (times) | Half-softening temp. (° C.) | Period in which tens. str. at 30° C. drops below 300 N/mm$^2$ |
| Example of this invention | 1 | 35 | 13 | 96.5 | 53.6 | 59400 | 121 | over 12 months |
| | 2 | 35 | 13 | 96.5 | 56.0 | 61200 | 123 | " |
| | 3 | 35 | 13 | 96.5 | 57.4 | 59400 | 126 | " |
| | 4 | 35 | 13 | 96.5 | 54.1 | 60200 | 130 | " |
| | 5 | 35 | 13 | 96.5 | 55.7 | 58000 | 134 | " |
| | 6 | 35 | 13 | 96.5 | 52.4 | 59300 | 142 | " |
| | 7 | 35 | 13 | 96.5 | 56.6 | 60700 | 148 | " |
| | 8 | 35 | 13 | 91.3 | 38.5 | 43200 | 133 | " |
| | 9 | 35 | 15 | 99.7 | 61.1 | 64600 | 128 | " |
| | 10 | 35 | 11 | 93.0 | 49.1 | 52600 | 139 | " |
| | 11 | 35 | 18 | 91.3 | 26.8 | 32900 | 145 | " |
| | 12 | 35 | 15 | 93.0 | 46.4 | 52400 | 135 | " |
| | 13 | 35 | 12 | 91.3 | 41.2 | 49600 | 129 | " |
| | 14 | 35 | 14 | 94.2 | 49.4 | 55800 | 140 | " |
| | 15 | 35 | 8 | 94.2 | 57.7 | 62300 | 128 | " |
| | 16 | 35 | 17 | 94.2 | 43.4 | 44400 | 137 | " |
| | 17 | 18 | 14 | 97.0 | 54.8 | 458300 | 124 | " |
| | 18 | 9 | 14 | 97.0 | 52.9 | 2064200 | 125 | " |
| Comparative example | 1 | 35 | 11 | 98.3 | 64.7 | 66600 | 110 | 3 months |
| | 2 | 35 | 13 | 96.5 | 53.2 | 58500 | 115 | 5 months |
| | 3 | 35 | 13 | 96.5 | 55.4 | 59100 | 168 | over 12 months |
| | 4 | 35 | 13 | 96.5 | 53.6 | 60200 | 167 | " |
| | 5 | 35 | 15 | 99.7 | 58.9 | 64000 | 172 | " |
| | 6 | 35 | 18 | 91.3 | 28.4 | 24400 | 142 | " |

TABLE 2-continued

| | | Manufacturing process | | | | | |
|---|---|---|---|---|---|---|---|
| No. | Thickness ($\mu$m) | Grain dia. before rolling ($\mu$m) | Final roll reduction ratio (%) | $I/I_o$ of the (200) plane of cube texture | No. of flex cycles (times) | Half-softening temp. (° C.) | Period in which tens. str. at 30° C. drops below 300 N/mm² |
| 7 | 35 | 25 | 94.2 | 18.6 | 23400 | 153 | " |
| 8 | 35 | 14 | 88.3 | 17.1 | 20600 | 155 | " |
| 9 | 70 | 14 | 96.5 | 48.2 | 14800 | 144 | " |

On the other hand, the specimens of Comparative Example Nos. 1 and 2 with low Ag concentrations of less than 0.0100% had low half-softening temperatures below 120° C. When they were stored at 30° C., their tensile strength values decreased below 300 N/mm² within one year.

The specimens of Comparative Example Nos. 3 to 5 showed, respectively, a high Ag concentration above 0.0400 wt %, a total content of impurities, i.e., S, As, Sb, Bi, Se, Te, Pb, and Sn, exceeding 0.0030 wt %, and an oxygen concentration below 0.0100 wt %. The specimens, therefore, had half-softening temperatures of higher than 150° C. and posed a serious possibility of not being recrystallized during the course of FPC fabrication.

Comparative Example No. 6, with an oxygen concentration exceeding 0.0500 wt % and an increased $Cu_2O$ inclusion, showed a low flex fatigue property of fewer than 30,000 flex cycles despite a well developed cube texture.

Comparative Example No. 7 had a pre-rolling grain diameter of over 20 $\mu$m and Comparative Example No. 8 had a rolling reduction ratio of less than 90.0%. The both specimens, therefore, had $I/I_o$ values on the (200) plane of less than 20.0 and short flex life of less than 30,000 flex cycles. Moreover, because the plastic strains built up by rolling are limited, their half-softening temperatures were in excess of 150° C.

Comparative Example No. 9 had a thickness greater than 50 $\mu$m and therefore, despite a developed cube texture, the number of flex cycles was less than 30,000.

Figure 2:
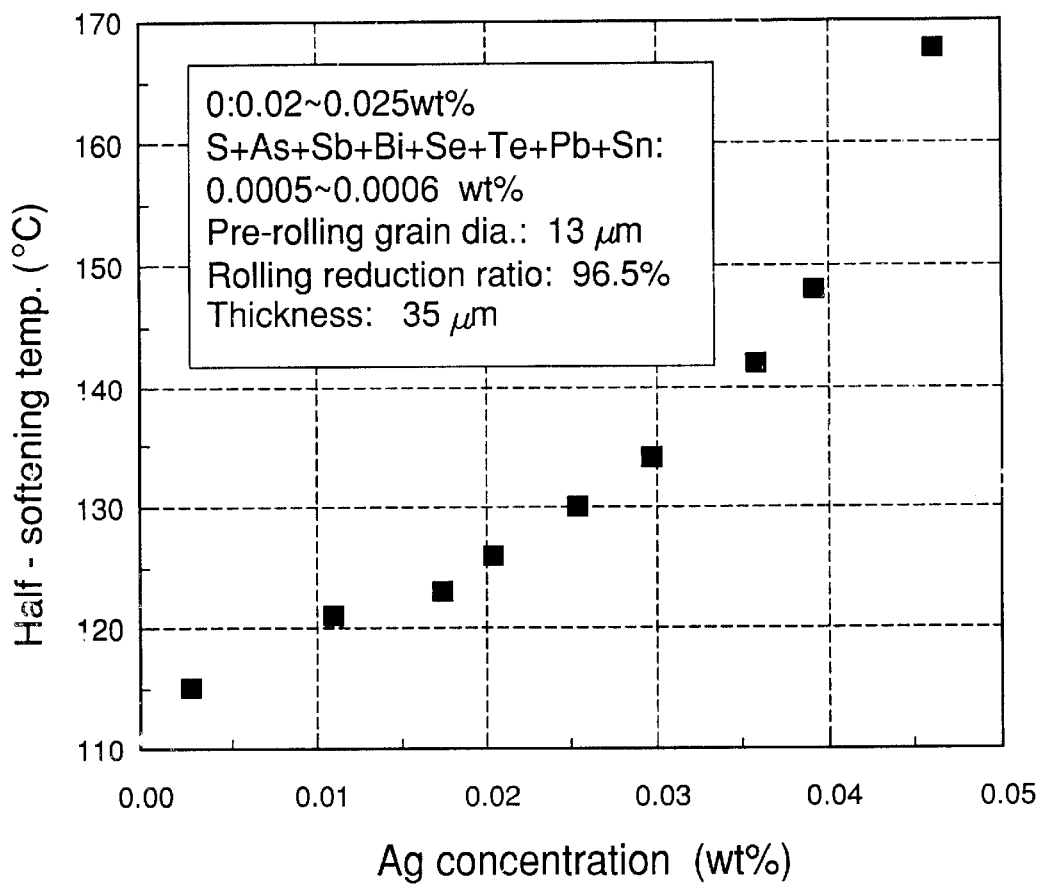
FIG. 2 is a graph showing the relation between Ag concentration and half-softening temperature.

In FIG. 2 is graphically represented the relation between the Ag concentration and half-softening temperature of Example Nos. 1–7 of this invention and Comparative Example Nos. 2–3, all made by the same process with the same composition except that the Ag concentration was varied. It can be seen that the larger the Ag concentration the higher the half-softening temperature and that the Ag concentration range of 0.0100–0.0400 wt % allows the target half-softening temperatures of 120–150° C. to be attained.

The rolled copper foil for flexible printed circuits according to the present invention possesses excellent flex fatigue property. It also has adequate half-softening temperature. Since it does not soften while in storage or upon annealing, it is desirably workable for fabrication into flexible printed circuits. Needless to say, the copper foil is suitable as well for applications other than FPCs, such as electrodes of lithium ion secondary batteries.

What is claimed is:

1. A rolled copper foil for flexible printed circuits consisting essentially of, all by weight, from 0.0100 to 0.0400% of Ag, from 0.0100 to 0.0500% of oxygen, not more than 0.0030% in total of one or more elements selected from the group consisting of S, As, Sb, Bi, Se, Te, Pb, and Sn, and the balance copper, said foil having a thickness in the range of 5 to 50 $\mu$m, a half-softening temperature of 120 to 150° C. and retaining a tensile strength of at least 300 N/mm² at 30° C., and possessing excellent flex fatigue property and adequate softening property.

2. A rolled copper foil for flexible printed circuits consisting essentially of, all by weight, from 0.0100 to 0.0400% of Ag, from 0.0100 to 0.0500% of oxygen, not more than 0.0030% in total of one or more elements selected from the group consisting of S, As, Sb, Bi, Se, Te, Pb, and Sn, and the balance copper, said foil having a thickness in the range of 5 to 50 $\mu$m, the intensity (I) of the (200) plane determined by X-ray diffraction of the rolled surface after annealing at 200° C. for 30 minutes being $I/I_o>20$ with respect to the X-ray diffraction intensity ($I_o$) of the (200) plane of fine copper powder, said foil having a half-softening temperature of 120 to 150° C. and retaining a tensile strength of at least 300 N/mm² at 30° C., and possessing excellent flex fatigue property and adequate softening property.

* * * * *